United States Patent
Kalia et al.

(12) 
(10) Patent No.: US 11,652,446 B2
(45) Date of Patent: May 16, 2023

(54) SINGLE STAGE FREQUENCY MULTIPLIER USING DIFFERENT TYPES OF SIGNAL MIXING MODES

(71) Applicant: TEXAS INSTRUMENTS INCORPORATED, Dallas, TX (US)

(72) Inventors: Sachin Kalia, Dallas, TX (US); Tolga Dinc, Dallas, TX (US); Swaminathan Sankaran, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/694,953

(22) Filed: Mar. 15, 2022

(65) Prior Publication Data
US 2022/0352853 A1 Nov. 3, 2022

Related U.S. Application Data (63) Continuation of application No. 17/246,425, filed on Apr. 30, 2021, now Pat. No. 11,316,476.

(51) Int. Cl.
| | | |
|---|---|---|
| H03D 7/14 | (2006.01) | |
| H03D 7/12 | (2006.01) | |
| H03D 7/16 | (2006.01) | |

(52) U.S. Cl.
CPC ........... *H03D 7/1458* (2013.01); *H03D 7/125* (2013.01); *H03D 7/1433* (2013.01); *H03D 7/1441* (2013.01); *H03D 7/16* (2013.01)

(58) Field of Classification Search
CPC ............ H03D 7/12; H03D 7/125; H03D 7/14; H03D 7/1425; H03D 7/1433; H03D 7/1441; H03D 7/145; H03D 7/1458; H03D 7/1466; H03D 7/1475; H03D 7/1483; H03D 7/1491; H03D 7/16; H03D 7/161; H03D 7/163; H03D 7/165; H03D 7/166; H03D 2200/01; H03K 5/156; H03K 5/00006; G06F 7/68

See application file for complete search history.

(56) References Cited

U.S. PATENT DOCUMENTS

| | | | |
|---|---|---|---|
| 10,581,415 B2 * | 3/2020 | Chakraborty | .......... H03K 5/131 |
| 10,601,372 B1 * | 3/2020 | Krishnamurthi | ..... H03D 7/1458 |
| 11,316,476 B1 * | 4/2022 | Kalia | ....................... H03D 7/16 |
| 2015/0091642 A1 | 4/2015 | Sankaran et al. | |
| 2019/0199334 A1 * | 6/2019 | Chakraborty | .......... H04B 7/084 |

* cited by examiner

*Primary Examiner* — Long Nguyen (74) *Attorney, Agent, or Firm* — Valerie M. Davis; Frank D. Cimino (57) ABSTRACT

A frequency multiplier includes an input section having inputs to receive an input signal having an input frequency, a mixer section, and an output section magnetically coupled to the input section and generating an output signal in response to the input signal. The mixer section may be coupled to the input section by a common mode node forming a path for a common mode current to flow to the mixer section and be magnetically coupled to the common mode node. The input section may generate a signal current, and the mixer section may be magnetically coupled to the input section and be directly capacitively coupled to the input section through a capacitor in a signal current path. The mixer section may have differential inputs capacitively coupled to the input section and also be coupled to the input section through a current path. A current helper section may be coupled to the current path.

18 Claims, 9 Drawing Sheets

SINGLE STAGE FREQUENCY MULTIPLIER USING DIFFERENT TYPES OF SIGNAL MIXING MODES

CROSS-REFERENCE TO RELATED APPLICATION(S)

This application is a continuation of, and claims priority under 35 U.S.C. § 120 on, application Ser. No. 17/246,625, filed Apr. 30, 2021, now U.S. Pat. No. 11,316,476, and having the same title as the present application. The content of this related application is incorporated by reference herein in its entirety.

FIELD OF DISCLOSURE

This disclosure relates generally to a single stage frequency multiplier using different type of signal mixing, and more particularly to a stacked single stage frequency multiplier using common mode (CM) and differential mode (DM) mixing.

BACKGROUND

Frequency multipliers are widely used in the electronic industry, such as in communication applications. A frequency multiplier generates one or more output signals whose frequencies are harmonics (multiples) of the frequency of the input signal. Generation of higher harmonics typically requires back-to-back multipliers. For example, a 6× generation implementation uses a 2× multiplier followed by a 3× multiplier, or vice versa. Intermediate buffering is required. That is, each multiplication stage is followed by a buffer. Such configuration requires a relatively large amount of area to accommodate the multiple stages and buffering, as well as additional power to operate, particularly in the mmWave frequency range, e.g., frequencies greater than 30 GHz. Moreover, these approaches generate one or more undesired harmonics relatively close to the desired harmonic. This complicates rejection of these undesired harmonic(s) during subsequent signal processing. For example, these approaches lead to unwanted interference and emission. A solution to these issues is desirable.

SUMMARY

In accordance with an example, a frequency multiplier comprises an input section having inputs configured to receive an input signal having an input frequency; a mixer section coupled to the input section by a common mode node that forms a path for a common mode current to flow to the mixer section, the mixer section also magnetically coupled to the common mode node; and an output section magnetically coupled to the mixer section. The output section is configured to generate, in response to the input signal, an output signal.

In accordance with an example, a frequency multiplier comprises an input section having inputs configured to receive an input signal having an input frequency, the input section configured to generate a signal current; a mixer section magnetically coupled to the input section and directly capacitively coupled to the input section through a capacitor in a signal current path; and an output section magnetically coupled to the mixer section. The output section is configured to generate an output signal.

In accordance with an example, a frequency multiplier comprises an input section having inputs configured to receive an input signal having an input frequency; a mixer section having differential inputs capacitively coupled to the input section, the mixer section further coupled to the input section through a current path; an output section magnetically coupled to the mixer section, the output section being configured to generate an output signal; and a current helper section coupled to the current path.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

The terms "connected," "coupled" and the like, as used herein, include direct connection or coupling between two elements, indirect connection or coupling through one or more intervening elements, as well as contactless communication.

In example arrangements, the problem of providing a reduced footprint, lower power frequency multiplier capable of generating higher multiple harmonics, e.g., 6× the frequency of the input signal, and provides for better rejection of unwanted harmonics is solved. In an example, a stacked single stage frequency multiplier is configured to generate a desired, e.g., 2×, differential switching voltage and a desired, e.g., 4×, common mode (CM) signal current, e.g., $I_{4f0}$. The CM signal current is fed from an input section, e.g., a 4-phase push-push configured input section, through a CM node into a stacked mixer section that reuses the CM current. In some examples, the differential inputs of the mixer section are magnetically coupled to allow for DC biasing of the mixer section for further performance optimization. Other examples include structure to capacitively couple the input section to the mixer section to allow for independent control over bias points for improved 4× CM signal current generation and mixer conversion gain, and/or structure to improve overall conversion gain by resonating out shunt capacitance at the common mode node. In some examples, the differential switching signals are capacitively coupled instead of magnetically coupled. In some examples, structure is provided to improve biasing of the mixer section for improved conversion gain while also allowing for improved 4× CM signal current generation.

Figure 1A:
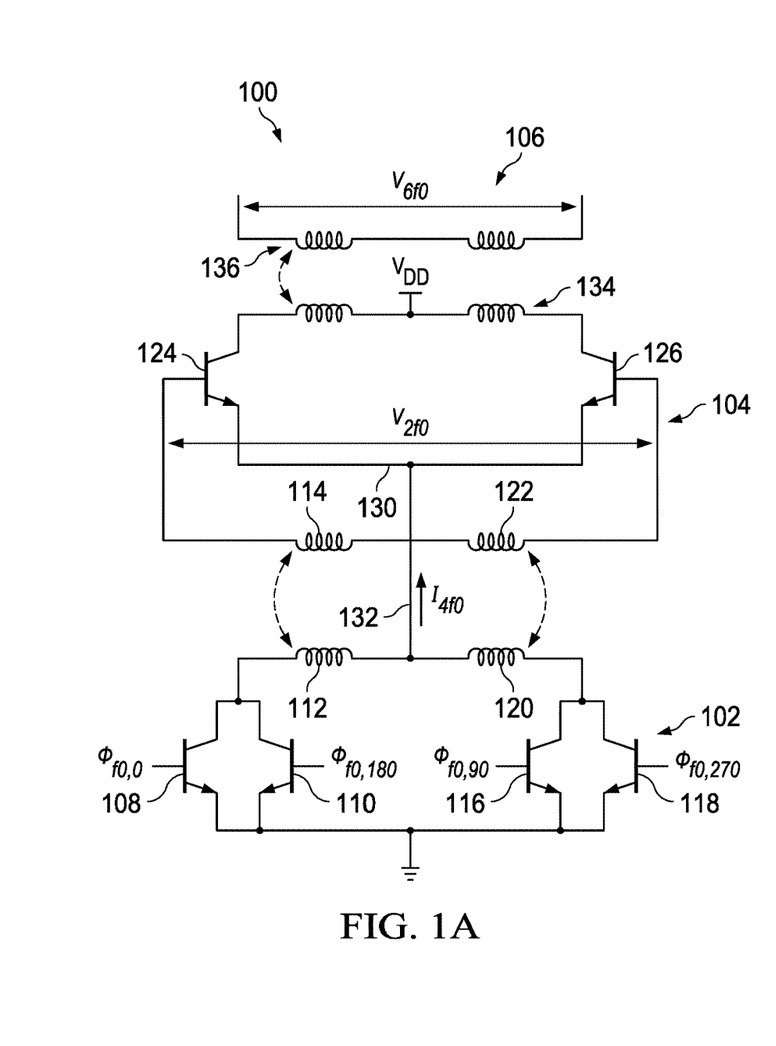
FIGS. 1A and 1B are circuit diagrams of examples of stacked 6× frequency multipliers implemented with bipolar junction transistors (BJTs).
Figure 1B:
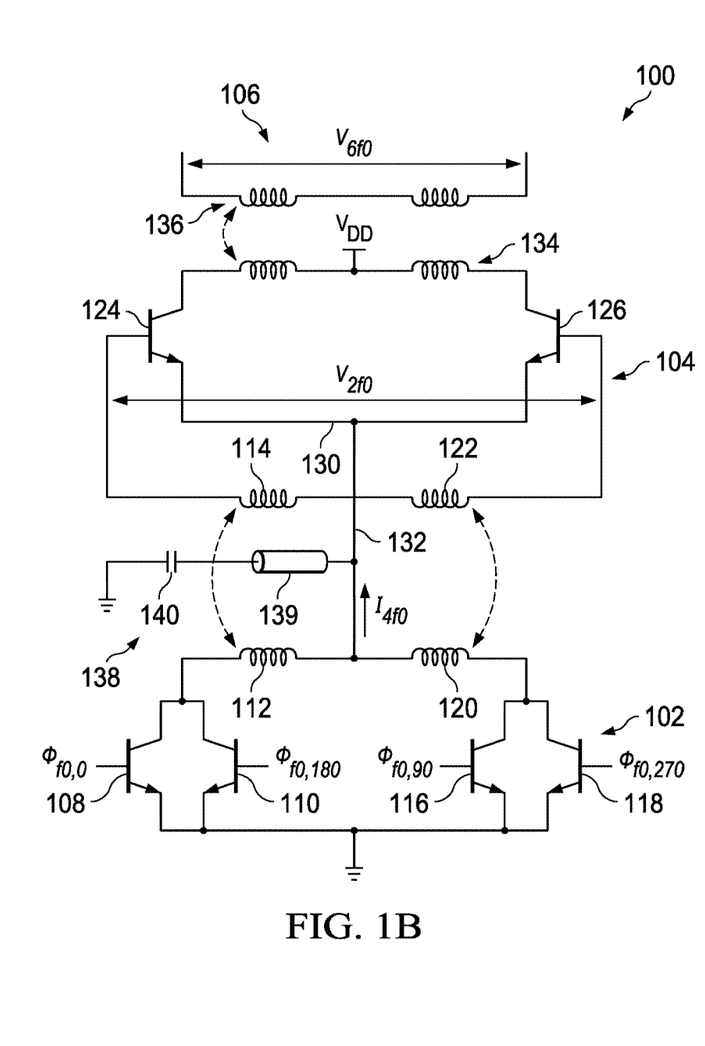

FIGS. 1A and 1B (collectively, FIG. 1) are circuit diagrams showing examples of a stacked 6× frequency multiplier 100 implemented with bipolar junction transistors (BJTs). Frequency multiplier 100 may include three functional circuits or sections: an input section 102, a mixer section 104 and an output section 106. In this example, input section 102 includes a first pair of transistors 108 and 110 coupled in a push-push arrangement. That is, the collectors of transistors 108 and 110 are coupled to together and to the same end of a coil 112, which is magnetically coupled to a coil 114 to form a transformer. Input section 102 also includes a second pair of transistors 116 and 118 also coupled in a push-push arrangement. The collectors of transistors 116 and 118 are coupled together and to the same end of a coil 120, which is magnetically coupled to a coil 122 to form a transformer. Coils 112 and 120 form differential outputs of input section 104. The emitters of transistors 108, 110, 116 and 118 are coupled together and may be coupled directly or indirectly to ground.

A quadrature phase input signal φ having a frequency $f_0$ is applied to the bases of transistors 108, 110, 116 and 118. In this example, transistors 108, 110, 116 and 118 receive input signals $\varphi_{f0,0}$, $\varphi_{f0,180}$, $\varphi_{f0,90}$, $\varphi_{f0,270}$, respectively. Quadrature phases applied to input section 102 may be generated passively, for example, by a polyphase filter (PPF) or hybrid thereof. Alternatively, the input quadrature phases may be actively generated via a quadrature voltage-controlled oscillator (QVCO).

Mixer section 104 of frequency multiplier 100 includes two transistors 124 and 126, the bases of which are magnetically coupled to allow for DC biasing. That is, the base of transistor 124 is coupled to coil 114 that is magnetically coupled to coil 112, and the base of transistor 126 is coupled to coil 122 that is magnetically coupled to coil 120.

The emitters of transistors 124 and 126 are coupled together to form a common mode (CM) node 130 that also includes a current path 132, as well as coils 112 and 120. The collectors of transistors 124 and 126 are coupled to the supply voltage $V_{DD}$ through coil 134, which is magnetically coupled to coil 136 of output section 106.

Figure 2:
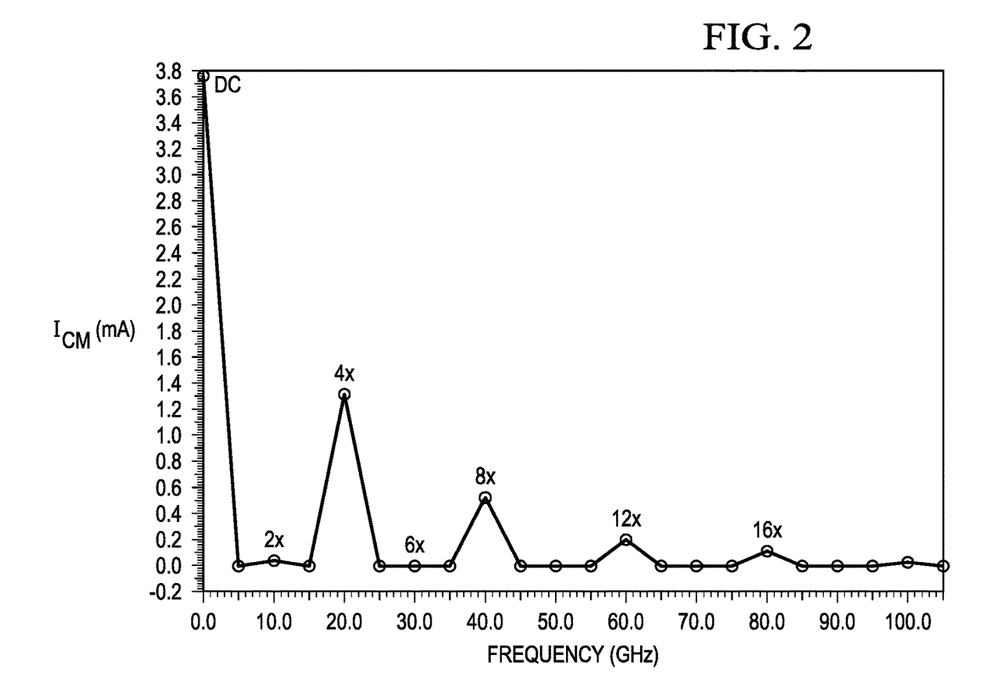
FIG. 2 is a graph of the harmonic current ($I_{CM}$) through a common mode (CM) node of the frequency multiplier of FIG. 1A at different harmonics for a particular input frequency.

In response to the quadrature phase input signal, complimentary push-push pairs of transistors, i.e., first transistor pair 108, 110 and second transistor pair 116, 118, generate a common mode current $I_{CM}$ that flows through current path 132 at multiples of $f_0$. For example, as shown in FIG. 2, using an input signal y at 5 GHz, i.e., $f_0$=5 GHz, $I_{CM}$ is generated at multiples of $4f_0$, with $4f_0$ being the dominate frequency of $I_{CM}$. That is, $I_{4f0}$ is the dominate current through current path 132, as shown in FIGS. 1A and 1B.

Figure 3:
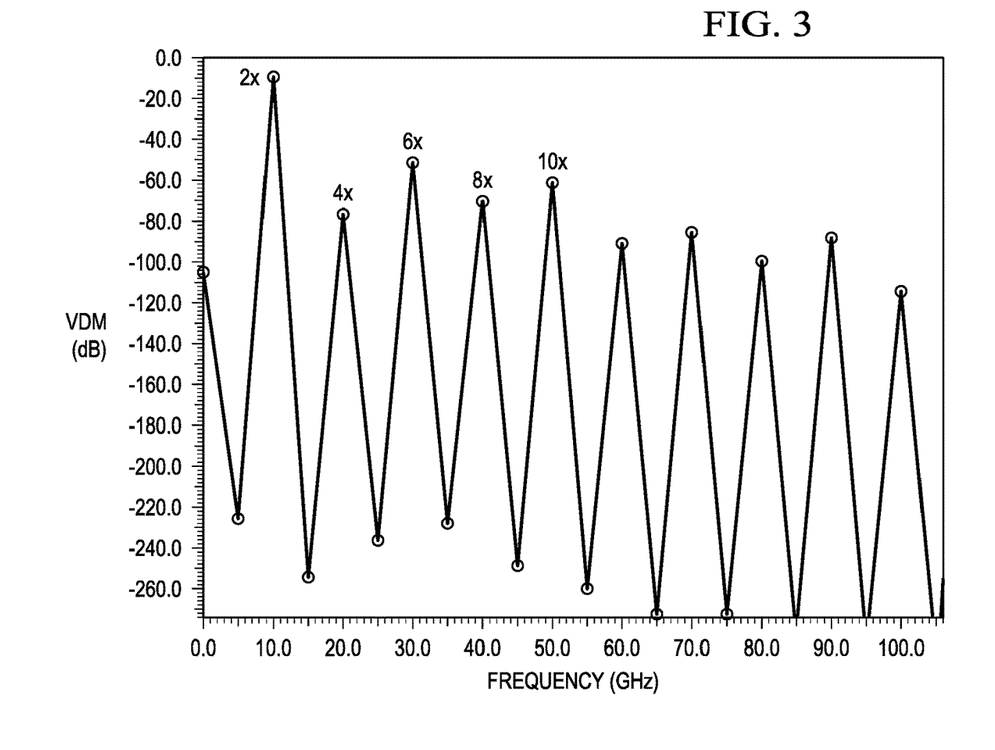
FIG. 3 is a graph of the differential switching voltage (VDM) across differential mode (DM) nodes of the frequency multiplier of FIG. 1A at different harmonics for a particular input frequency.

At mixing section 104, differential switching voltage VDM is applied to the bases of transistors 124 and 126, each of which forms a differential mode (DM) node. In the example of FIG. 3, at a 5 GHz input signal φ, VDM applied across the DM nodes has content at $2f_0$, $6f_0$, $10f_0$, etc., with the dominate frequency being $2f_0$, i.e., $V_{2f0}$ is the dominate VDM as shown in FIGS. 1A and 1B.

Figure 4:
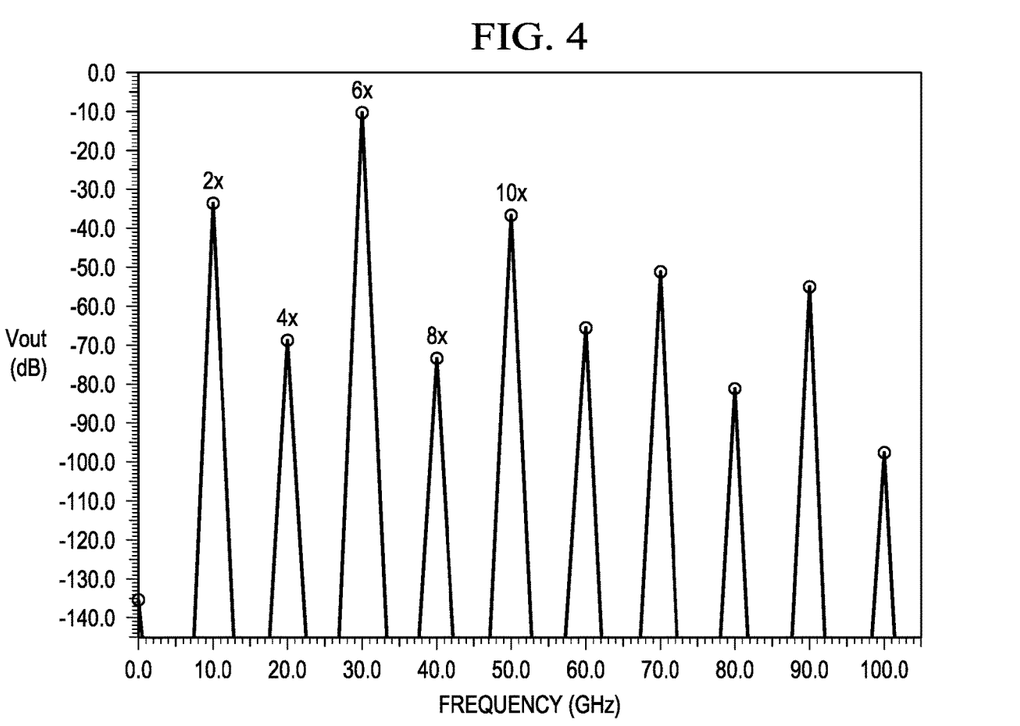
FIG. 4 is a graph of the output voltage ($V_{OUT}$) of the frequency multiplier of FIG. 1A at different harmonics for a particular input frequency.

Output section 106 includes coil 136 magnetically coupled to coil 134 which form a transformer. A differential output signal $V_{out}$ having a frequency which is a multiple of that of the input frequency $f_0$ is generated from the ends of coil 136. In the example of FIG. 4, in which the input signal φ has a frequency of 5 GHz, which generates an $I_{CM}$ of frequency $4f_0$ ($I_{4f0}$) and a VDM of $2f_0$ ($V_{2f0}$), $V_{out}$ is a sixth harmonic ($6f_0$) of the input signal, and is thus denoted $V_{6f0}$ in FIGS. 1A and 1B. As also shown in FIG. 4, the closest undesired sub-dominate harmonic to the desired dominate frequency ($6f_0$) is at $2f_0$, i.e., $4f_0$ away.

In addition to the increased spacing between the desired output signal and undesired sub-dominate harmonics, the examples of FIG. 1, eliminate buffer stages, which reduces the area required to accommodate frequency multiplier 100. Such elimination also saves power, and the reuse of current leads to additional power savings even when operating at higher voltages ($V_{DD}$).

The elimination of the buffering stages is also significant in another respect. Buffering after each multiplier stage requires tuned loads (inductors, transformers) when operating at higher frequencies. Even if additional buffering is used in the examples of FIG. 1, it may be done at the fundamental input frequency $f_0$ where RC loads suffice.

The configuration of FIG. 1B differs from that of FIG. 1A in that an inductor-capacitor circuit 138 is coupled to current path 132 to further improve overall conversion gain by resonating out any shunt capacitance at CM node 130. As shown in FIG. 1B, one end of an inductor 139 is coupled to current path 132 and the other end of inductor 139 is coupled to a capacitor 140 in series. The other end of capacitor 140 is coupled to ground. Capacitor 140, which has a relatively large capacitance, is preferably sized to be a short at $4f_0$. Circuit 138 does not require any additional area overhead; circuit 138 can be absorbed within the transformer area formed by coils 112 and 114.

Figure 5A:
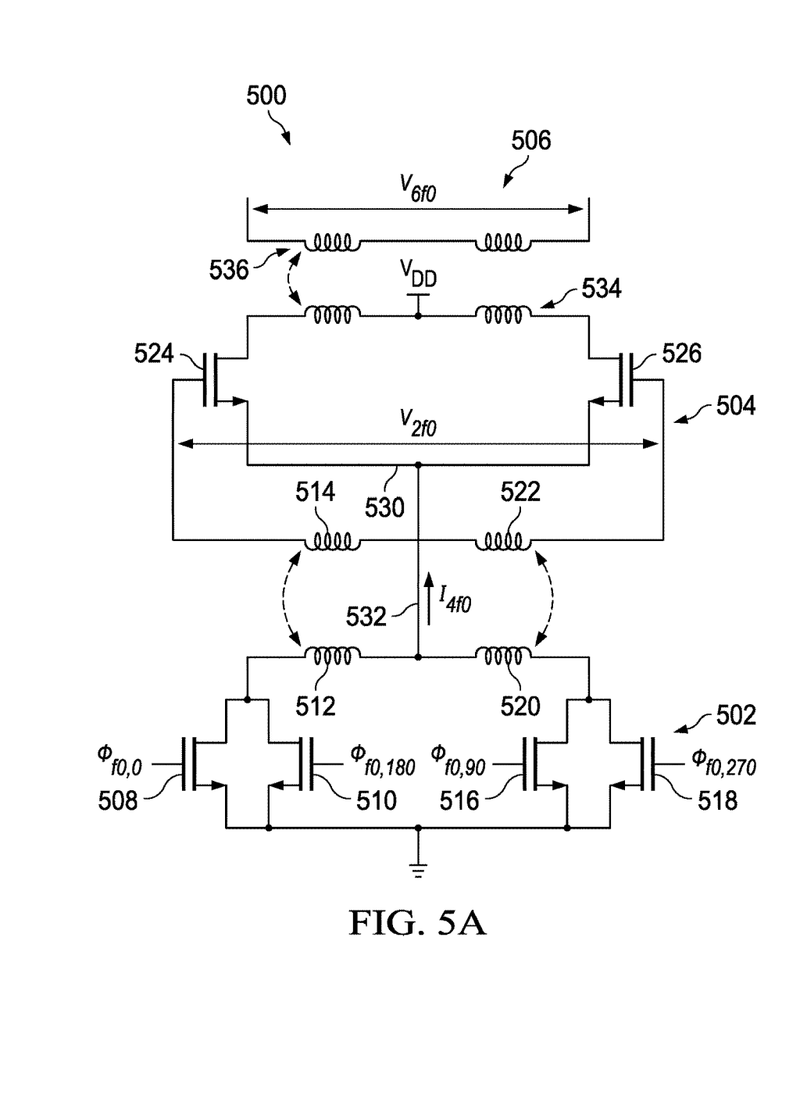
FIGS. 5A and 5B are circuit diagrams of examples of stacked 6× frequency multipliers implemented with metal-oxide-semiconductor (MOS) transistors.
Figure 5B:
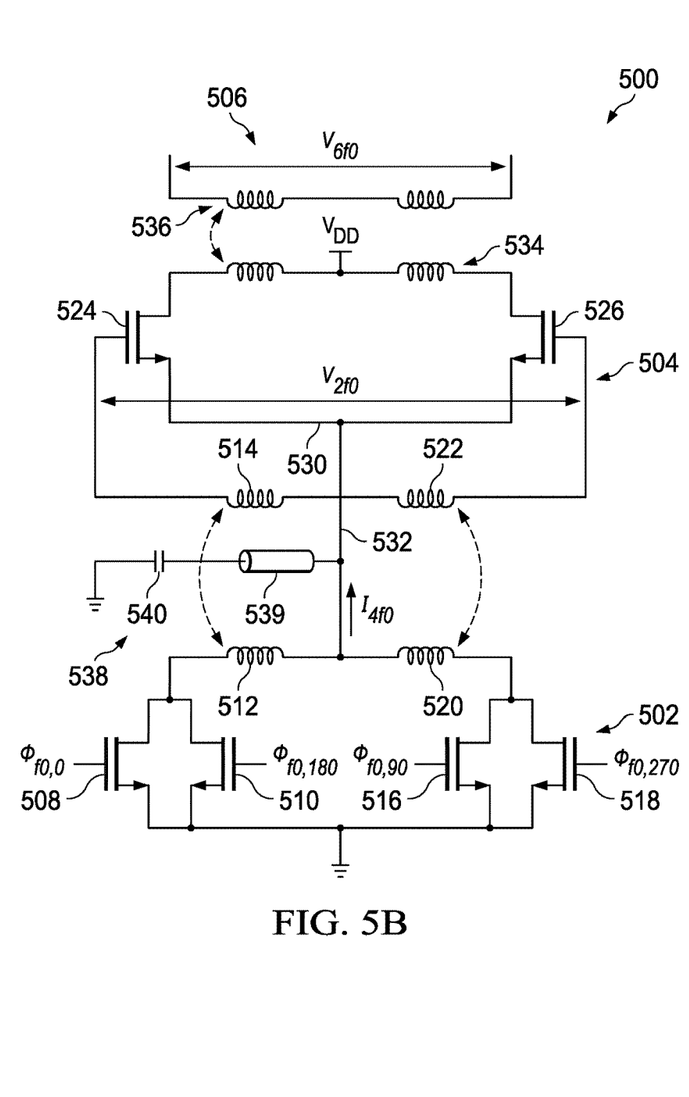

FIGS. 5A and 5B (collectively, FIG. 5) are circuit diagrams showing examples of a stacked 6× frequency multiplier 500 implemented with metal-oxide-semiconductor (MOS) transistors. The specific examples shown uses NMOS transistors, although an equivalent configuration may be implemented using PMOS transistors or a combination of NMOS and PMOS transistors. The examples of FIG. 5 are substantially the same as those of FIG. 1 in terms of signals input, generated and output. The examples of FIG. 5 are implemented with MOS, e.g., NMOS, transistors instead of BJTs.

Frequency multiplier 500 includes an input section 502, a mixer section 504 and an output section 506. Input section 502 includes two transistor pairs arranged in a push-push configuration. Transistors 508 and 510 form one such pair. The drains of transistors 508 and 510 are coupled to one end of coil 512 that is magnetically coupled to coil 514. Transistors 516 and 518 form the second input pair. The drains of transistors 516 and 518 are coupled to one end of coil 520 that is magnetically coupled to coil 522. Coils 512 and 520 form differential outputs of input section 502. The sources of transistors 508, 510, 516 and 518 are coupled together and may be coupled directly or indirectly to ground.

A quadrature phase input signal φ having a frequency $f_0$ is applied to the gates of transistors 508, 510, 516 and 518 at phases of 0°, 180°, 90° and 270°, respectively. Quadrature phases applied to input section 102 may be generated passively, for example, by a PPF or hybrid thereof. Alternatively, the input quadrature phases may be actively generated via a QVCO.

Mixer section 504 of frequency multiplier 500 includes two transistors 524 and 526, the gates of which are magnetically coupled to allow for DC biasing. That is, the gate of transistor 524 is coupled to coil 514 that is magnetically coupled to coil 512, and the gate of transistor 526 is coupled to coil 522 that is magnetically coupled to coil 520.

The sources of transistors 524 and 526 are coupled together to form a common mode (CM) node 530 that also includes a current path 532, as well as coils 512 and 520. The drains of transistors 524 and 526 are coupled to the supply voltage $V_{DD}$ through coil 534, which is magnetically coupled to coil 536 of output section 506. Coil 534 is also coupled to $V_{DD}$.

Using an input signal y at 5 GHz, i.e., $f_0$=5 GHz, complimentary push-push pairs of transistors, i.e., first transistor pair 508, 510 and second transistor pair 516, 518, generate a common mode current $I_{CM}$ that flows through current path 532 at multiples of $4f_0$, with $4f_0$ being the dominate frequency of $I_{CM}$, i.e., $I_{4f0}$ is the dominate current through current path 532, as indicated in FIGS. 5A and 5B.

At mixing section 504, differential switching voltage VDM is applied to the gates of transistors 524 and 526, each of which forms a differential mode (DM) node. VDM applied across the DM nodes has content at $2f_0$, $6f_0$, $10f_0$, etc., with the dominate frequency being $2f_0$. That is, $V_{2f0}$ is the dominate VDM, as indicated in FIGS. 5A and 5B.

Output section 506 includes coil 536 magnetically coupled to coil 534 which form a transformer. With a 5 GHz input signal φ, a differential output signal having a frequency six times that of the input frequency $f_0$ ($V_{6f0}$) is generated from the ends of coil 536 through an $I_{CM}$ of frequency $4f_0$ ($I_{4f0}$) and a VDM of $2f_0$ ($V_{2f0}$). That is, differential switching voltage $V_{6f0}$, which is a sixth harmonic ($6f_0$) of the input signal, is output from output section 506. In this example, the closest undesired sub-dominate harmonic to the desired dominate frequency ($6f_0$) is at $2f_0$, i.e., $4f_0$ away.

As described with respect to example frequency multiplier 100 of FIG. 1, frequency multiplier 500 also may be varied to include inductor-capacitor circuit 538, which variation is shown in FIG. 5B. Inductor 539 is coupled between current path 532 and capacitor 540. Circuit 538 can improve overall conversion gain by resonating out any shunt capacitance at CM node 530. Circuit 538 does not require any additional area overhead; circuit 538 can be absorbed within the transformer area formed by coils 512 and 514.

In addition to providing increased spacing between the desired output harmonic and the closest undesired harmonic, the examples of FIG. 5 also eliminate the need for buffer stages, which reduces the area required to accommodate the circuit. Such elimination also saves power, and the reuse of current leads to additional power savings even when operating at higher voltages ($V_{DD}$).

Figure 6:
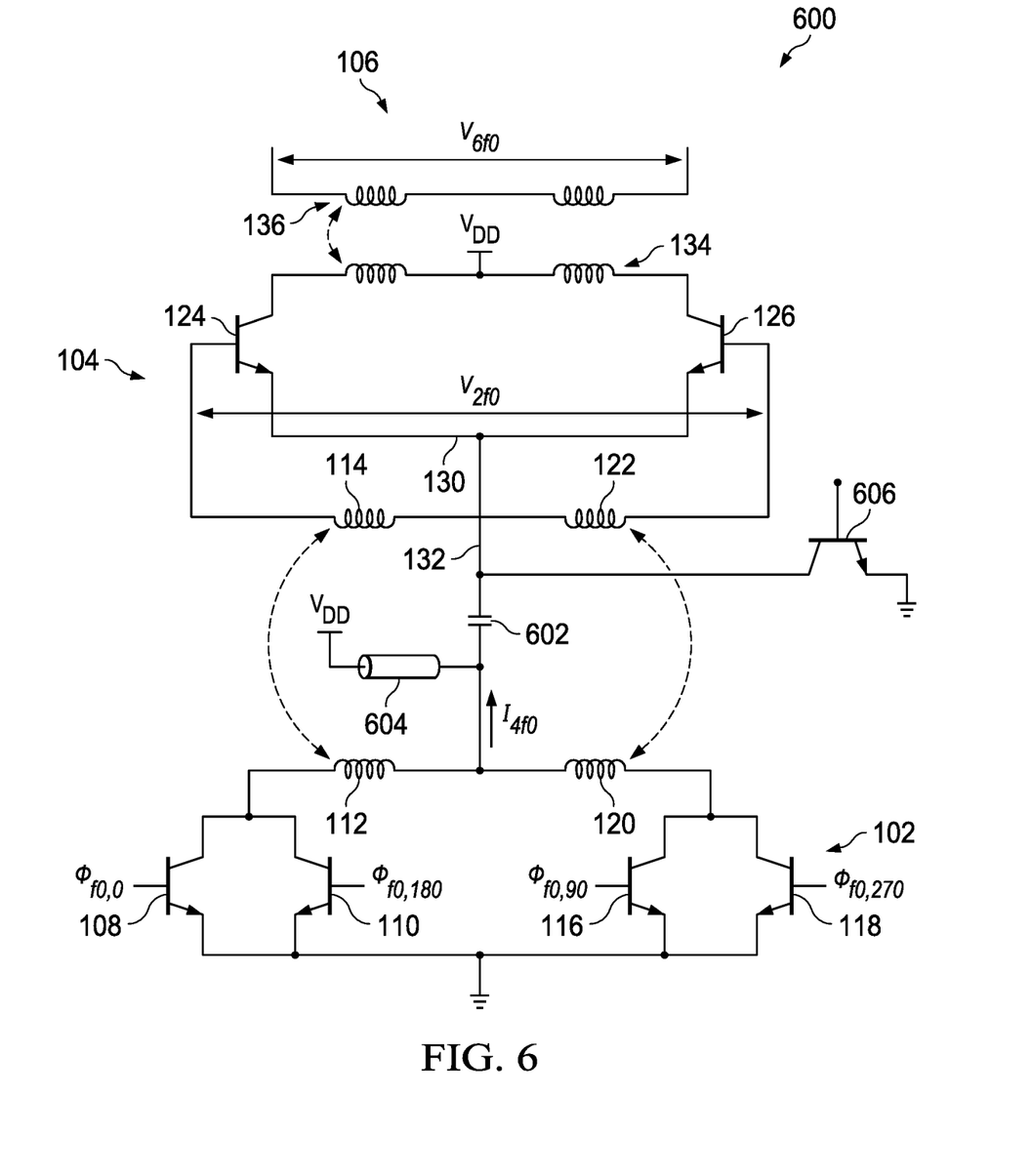
FIG. 6 is a circuit diagram of another example of a stacked 6× frequency multiplier implemented with BJTs.

FIG. 6 is a circuit diagram of another example of a stacked 6× frequency multiplier 600 implemented with BJTs. Like elements in FIG. 6 are identified by the same reference numerals used in FIG. 1. The configuration of FIG. 6 differs from that of FIG. 1A in that frequency multiplier 600 includes capacitive coupling between input section 102 and mixer section 104. To this end, capacitor 602 is disposed in current path 132. Frequency multiplier 600 also includes an inductor 604 coupled to CM node 130 at the input section end of capacitor 602. The other end of inductor 604 is coupled to the supply voltage $V_{DD}$. A transistor 606 is coupled to CM node 130 at the other end of capacitor 602.

The capacitive coupling allows for independent control over the bias points for optimal $4f_0$ current, e.g., $I_{4f0}$, generation and mixer conversion gain. Inductor 604 resonates shunt capacitance at CM node 130 at $4f_0$, so as to allow all the signal current, e.g., $I_{CM}$ at $4f_0$, to feed into the emitter node of transistors 124 and 126. Capacitor 602 is sized to be a short at $4f_0$. The base of transistor 606 is biased to improve 4× current generation.

Figure 7:
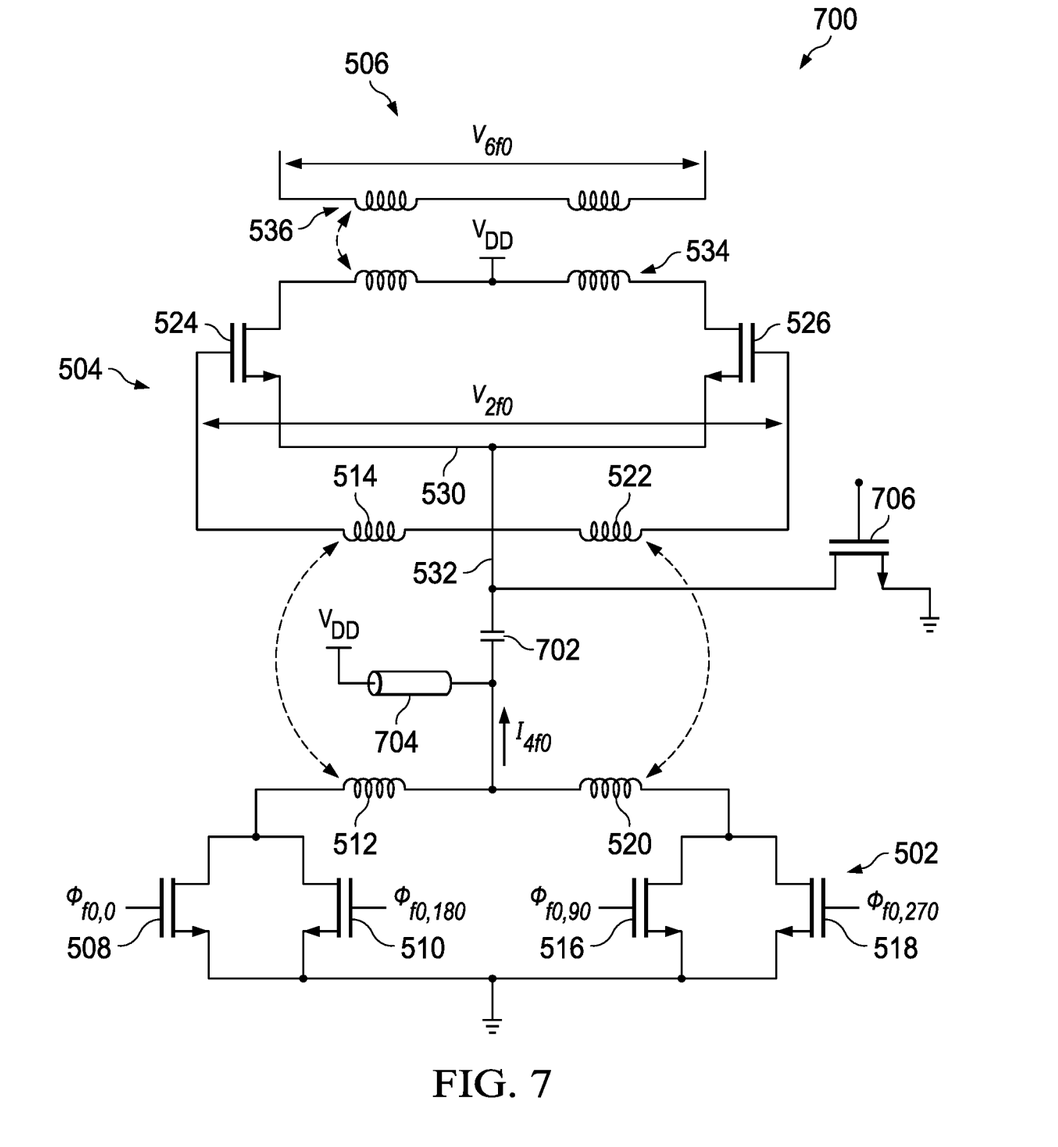
FIG. 7 is a circuit diagram of another example of a stacked 6× frequency multiplier implemented with MOS transistors.

FIG. 7 is a circuit diagram of another example of a stacked 6× frequency multiplier 700 implemented with MOS transistors. Frequency multiplier 700 is the MOS counterpart of, and is thus functionally similar, to frequency multiplier 600. Structurally, frequency multiplier 700 contains some of the same elements as frequency multiplier 500 of FIG. 5, and thus like elements are identified by the same reference numerals. The configuration of FIG. 7 differs from that of FIG. 5A in a similar way that the configuration of FIG. 6 differs from that FIG. 1A.

Frequency multiplier 700 includes capacitive coupling between input section 102 and mixer section 104, which coupling is implemented by capacitor 702 disposed in current path 132. Frequency multiplier 700 also includes an inductor 704 coupled to CM node 130 at the input section end of capacitor 702. In FIG. 7, the counterpart to transistor 606 of FIG. 6 is implemented as a MOS transistor 706 with its drain coupled to CM node 130 and its source coupled to ground.

As in the configuration of FIG. 6, the capacitive coupling in the configuration of FIG. 7 allows for independent control over the bias points for optimal $4f_0$ current generation and mixer conversion gain. Inductor 704 resonates shunt capacitance at CM node 130 at $4f_0$, so as to allow all $I_{CM}$ at $4f_0$ to feed into the source node of transistors 524 and 526. Capacitor 702 is preferably a short at $4f_0$. The gate of transistor 706 is biased to improve 4× current generation.

Figure 8A:
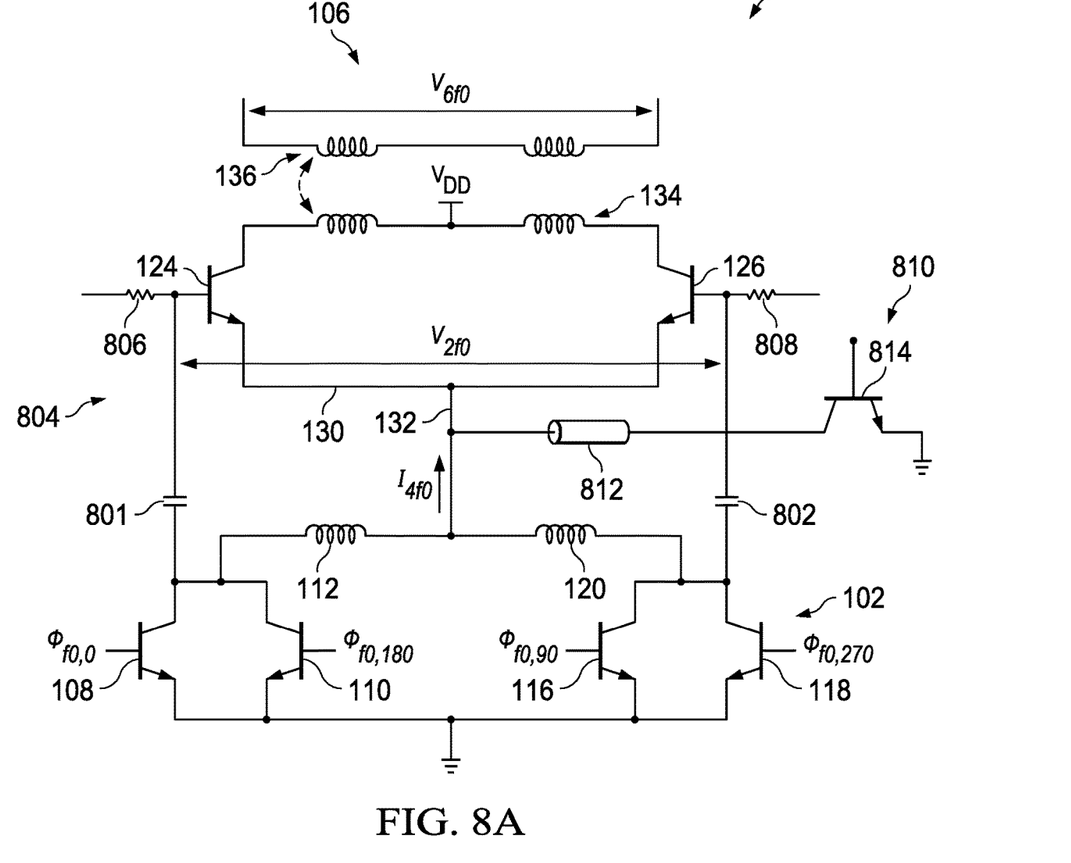
FIGS. 8A and 8B are circuit diagrams of still other examples of a stacked 6× frequency multiplier implemented with BJTs.
Figure 8B:
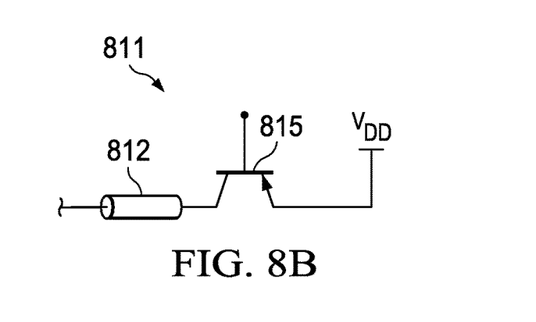
Figure 9A:
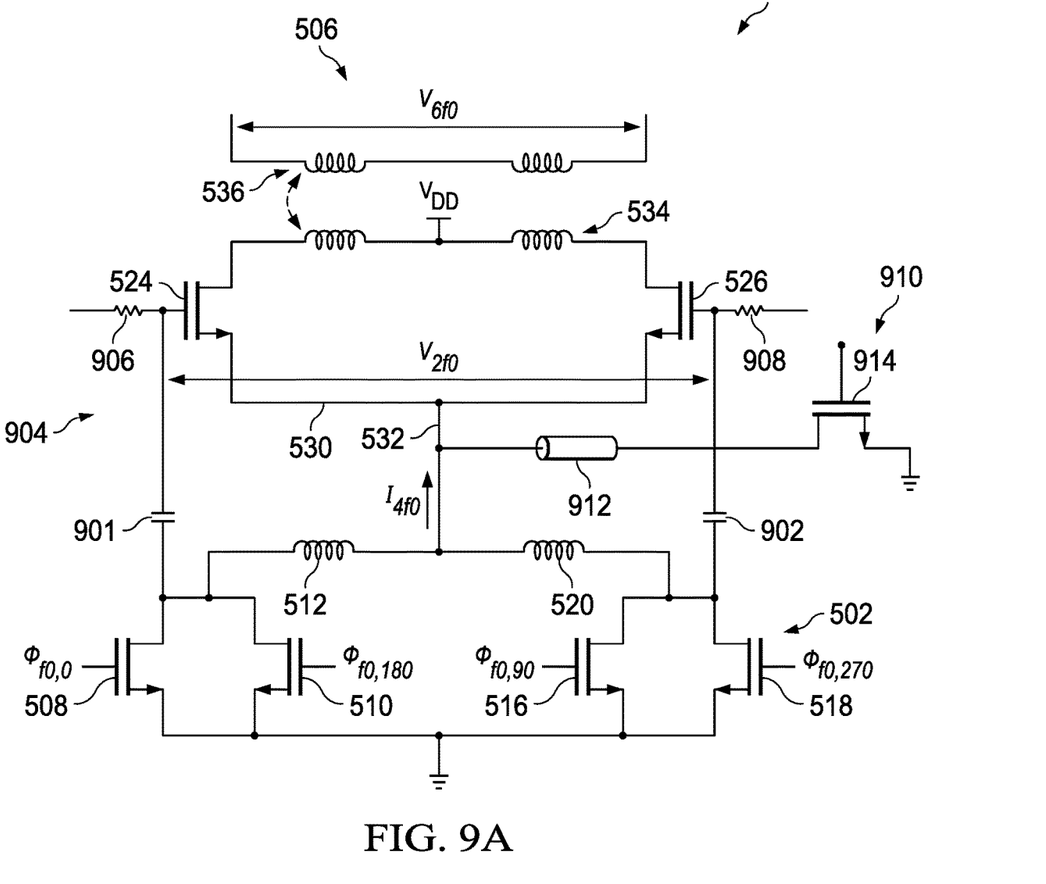
FIGS. 9A and 9B are circuit diagrams of further examples of a stacked 6× frequency multiplier implemented with MOS transistors.
Figure 9B:
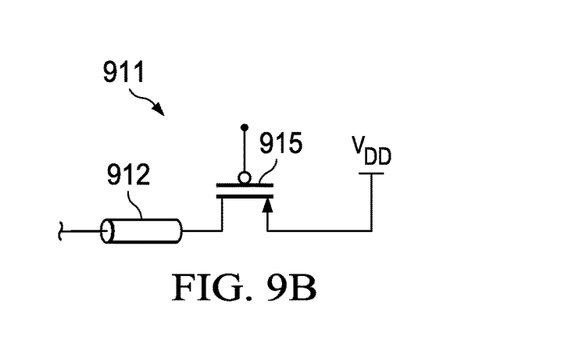

FIGS. 8A, 8B, 9A and 9B are circuit diagrams of still other examples of stacked 6× frequency multipliers. FIGS. 8A and 8B show two variations implemented with BJTs, and FIGS. 9A and 9B show two variations implemented with MOS transistors. These examples illustrate an optimal biasing scheme that allows the DC bias current through input section 102/502 to be different than that through mixer section 804/904 for independent performance optimization.

Referring to FIG. 8A, in frequency multiplier 800, differential switching signals $V_{2f0}$ are capacitively coupled via capacitors 801 and 802 and resistors 806 and 808. Also, common mode signal current $I_{4f0}$ is fed to mixer section 804 without magnetic coupling. To that end, frequency multiplier 800 does not include coils 114 and 122, as in frequency multiplier 100 of FIG. 1. Also, different than the configuration of frequency multiplier 100, frequency multiplier 800 includes a current helper section 810 that comprises an inductor 812 coupled between current path 132 of CM node 130 and the collector of an NPN transistor 814, the emitter of which is coupled to ground. Current helper section 810 with series inductance allows for improved biasing of mixer section 104 through resistors 806 and 808 for improved conversion gain and 4× current generation. Current helper section 810 increases the mixer section DC bias current relative to that of input section 102. The base of NPN transistor 814 is biased so that current helper section 810 acts as a current sink. Also, inductor 812 resonates out shunt parasitic capacitance at CM node 130 at 4× so as to allow more $I_{CM}$ at 4× ($I_{4f0}$) to feed into the emitters of transistors 124 and 126.

Another example of a current helper section, identified by reference numeral 811, is shown in FIG. 8B. Current helper section 811 includes a PNP transistor 815, the collector of which is coupled to inductor 812. The emitter of PNP transistor 815 is coupled to the supply voltage ($V_{DD}$). The example of FIG. 8B increases the input section DC bias current relative to that of mixer section 804. The base of PNP transistor 815 is biased so that current helper section 811 acts as a current source. As in the example of FIG. 8A, in the example of FIG. 8B, inductor 812 resonates out shunt parasitic capacitance at CM node 130 at 4× so as to allow more $I_{CM}$ at 4× ($I_{4f0}$) to feed into the emitters of transistors 124 and 126.

FIG. 9A shows a frequency multiplier 900, which is the MOS counterpart to frequency multiplier 800 of FIG. 8A. In frequency multiplier 900, differential switching signals $V_{2f0}$ are capacitively coupled via capacitors 901 and 902 and resistors 906 and 908. Also, common mode signal current $I_{4f0}$ is fed to mixer section 904 without magnetic coupling. To that end, frequency multiplier 900 does not include coils 514 and 522, as in frequency multiplier 500 of FIG. 5. Also, different than the configuration of frequency multiplier 500, frequency multiplier 900 includes a current helper section 910 that comprises an inductor 912 coupled between current path 132 of CM node 130 and the drain of an NMOS transistor 914, the source of which is coupled to ground. Current helper section 910 with series inductance allows for improved biasing of mixer section 104 through resistors 906 and 908 for improved conversion gain and 4× current generation. Current helper section 910 increases the mixer section DC bias current relative to that of input section 502. The gate of NMOS transistor 914 is biased so that current helper section 910 acts as a current sink. Also, inductor 912 resonates out shunt parasitic capacitance at CM node 130 at 4× so as to allow more $I_{CM}$ at 4× ($I_{4f0}$) to feed into the sources of transistors 524 and 526.

Another example of a current helper section, identified by reference numeral 911, is shown in FIG. 9B. Current helper section 911 includes a PMOS transistor 915, the drain of which is coupled to inductor 912. The source of PMOS transistor 915 is coupled to the supply voltage ($V_{DD}$). The example of FIG. 9B increases the input section DC bias current relative to that of mixer section 904. The gate of PMOS transistor 915 is biased so that current helper section 911 acts as a current source. Inductor 912 resonates out shunt parasitic capacitance at CM node 130 at 4× so as to allow more $I_{CM}$ at 4× ($I_{4f0}$) to feed into the sources of transistors 524 and 526.

Figure 10:
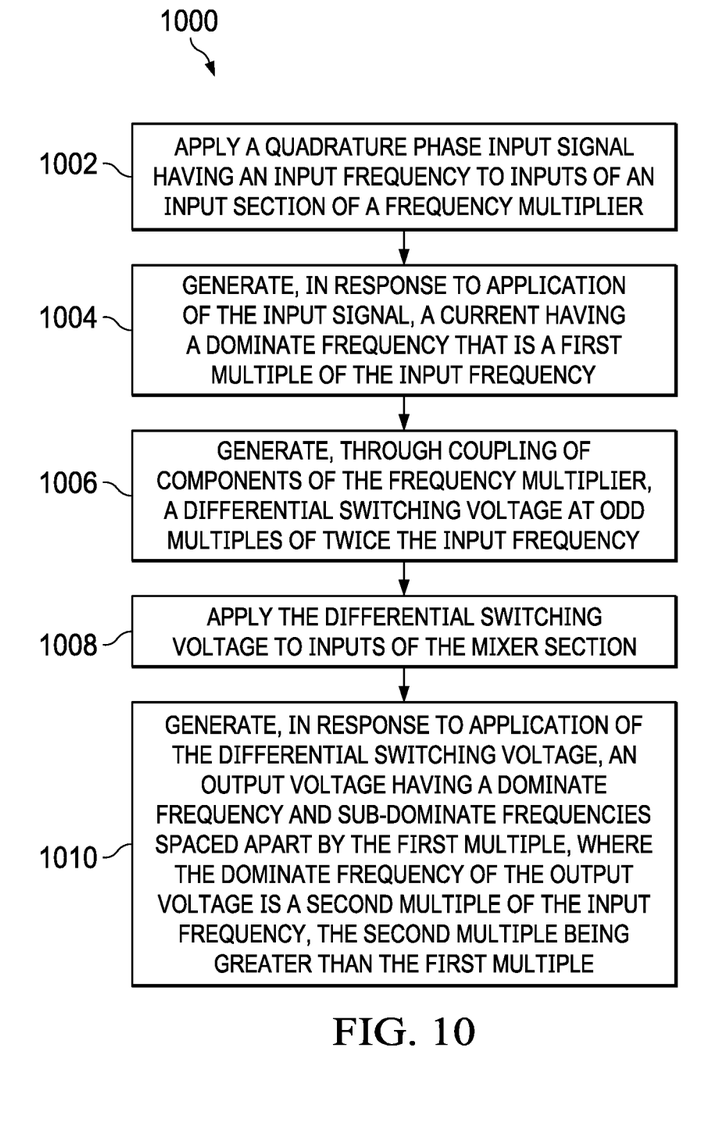
FIG. 10 is flow diagram of an example of generating an output signal at a desired harmonic that is a multiple of the input frequency and well-spaced from the closest undesirable sub-dominate harmonics.

FIG. 10 is a flow diagram of an example method 1000 of generating an output signal at a desired harmonic that is well-spaced from the closest undesirable sub-dominate harmonics. FIG. 10 is described in the context of BJT implementations but may be applied to other implementations, e.g., MOS implementations. In operation 1002 a quadrature phase input signal signals ($\varphi_{f0,0}$, $\varphi_{f0,180}$, $\varphi_{f0,90}$, $\varphi_{f0,270}$) having an input frequency $f_0$ is applied to inputs of an input section 102 of a frequency multiplier. In an example, $f_0$ is 5 GHz. In response to application of the input signal, in operation 1004 a current $I_{CM}$ having a dominate frequency that is a first multiple (e.g., 4) of the input frequency is generated. In an example, $I_{CM}$ is generated at multiples of $4f_0$, and the dominate $I_{CM}$ is $I_{4f0}$, as shown in FIG. 2. $I_{4f0}$ is considered the common mode signal current, or simply signal current. In operation 1006, a differential switching voltage VDM is generated through coupling between common mode node 130 and mixer section 104, or coupling between input section 102 and mixer section 104. In an example, VDM is generated through magnetic coupling between coils of common mode node 130 and coils of mixer section 104. In an example, VDM is generated through capacitive coupling between input and mixer sections 102 and 104. In an example, VDM is generated at odd multiples of $2f_0$, with the dominate frequency being $2f_0$, as shown in FIG. 3. VDM is applied to inputs of mixer section 104 in operation 1008. Based on the generated $I_{CM}$ and VDM, and output voltage ($V_{out}$) is generated in operation 1010. $V_{out}$ has a dominate frequency and sub-dominate frequencies that are spaced apart by the first multiple (e.g., 4), where the dominate frequency of $V_{out}$ is a second multiple (e.g., 6) of the input frequency $f_0$. In an example, $V_{out}$ is $V_{6f0}$, which is the dominate harmonic, and the closest sub-dominate harmonics are $4f_0$ away at $V_{2f0}$ and $V_{10f0}$, respectively, as shown in FIG. 4.

FIG. 10 depicts one possible order of operations to generate desired harmonics. The process may be performed in a different order than that described. Some operations may be combined into a single operation. Additional operations may be performed as well.

Various examples of compact, power-efficient frequency multipliers capable of generating a multiple order harmonic output signal, with the closest undesirable sub-dominate harmonics well-spaced from the desired harmonic, are provided. Exemplary architectures eliminate the need for buffer stages, thus reducing the size and power consumption of those devices compared to multiple stage frequency multipliers. Current reuse in exemplary architectures leads to additional power savings. The devices and circuits described herein may be implemented in a wide range of integrated frequency synthesizers, as well as in wireless/radar systems requiring harmonic generation and distribution.

Modifications of the described examples are possible, as are other examples, within the scope of the claims. Moreover, features described herein may be applied in other environments and applications consist with the teachings provided.

What is claimed is:

1. A frequency multiplier, comprising:
   an input section having inputs configured to receive an input signal having an input frequency;
   a mixer section coupled to the input section by a common mode node that forms a path for a common mode current to flow to the mixer section and magnetically coupled to the common mode node; and
   an output section magnetically coupled to the mixer section, the output section being configured to generate, in response to the input signal, an output signal.

2. The frequency multiplier of claim 1, wherein the output signal has a first frequency and second frequencies spaced apart by a first multiple, the first frequency being a second multiple of the input frequency, the second multiple being greater than the first multiple.

3. The frequency multiplier of claim 1, further comprising:
   a first pair of coils coupled to outputs of the input section and to the common mode node; and
   a second pair of coils coupled to inputs of the mixer section,
   wherein the mixer section is magnetically coupled to the input section through the first and second pairs of coils.

4. The frequency multiplier of claim 1, wherein the output section includes a first pair of coils, the frequency multiplier further comprising:
a second pair of coils coupled to outputs of the mixer section,
wherein the output section is magnetically coupled to the mixer section through the first and second pairs of coils.

5. The frequency multiplier of claim 1, further comprising:
an inductor having a first end coupled to the common mode node; and
a capacitor coupled to a second end of the inductor.

6. The frequency multiplier of claim 3, wherein the mixer section includes a pair of transistors, each having a control terminal, the second pair of coils coupled to the control terminals of the pair of transistors.

7. The frequency multiplier of claim 1, wherein the mixer section includes a pair of transistors, each having a current terminal coupled to each other and forming part of the common mode node.

8. A frequency multiplier, comprising:
an input section having inputs configured to receive an input signal having an input frequency, the input section configured to generate a signal current;
a mixer section magnetically coupled to the input section and directly capacitively coupled to the input section through a capacitor in a signal current path; and
an output section magnetically coupled to the mixer section, the output section being configured to generate an output signal.

9. The frequency multiplier of claim 8, wherein the output signal has a first frequency and second frequencies spaced apart by a first multiple, the first frequency of the output signal being a second multiple of the input frequency, the second multiple being greater than the first multiple.

10. The frequency multiplier of claim 8, further comprising a transistor having a first current terminal coupled to the signal current path between the capacitor and the mixer section and having a second current terminal coupled to ground.

11. The frequency multiplier of claim 8, further comprising an inductor coupled to the signal current path between the capacitor and the input section.

12. A frequency multiplier, comprising:
an input section having inputs configured to receive an input signal having an input frequency;
a mixer section having differential inputs capacitively coupled to the input section, the mixer section further coupled to the input section through a current path;
an output section magnetically coupled to the mixer section, the output section being configured to generate an output signal; and
a current helper section coupled to the current path.

13. The frequency multiplier of claim 12, wherein the output signal has a first frequency and second frequencies spaced apart by a first multiple, the first frequency of the output signal being a second multiple of the input frequency, the second multiple being greater than the first multiple.

14. The frequency multiplier of claim 12, wherein the current helper section includes an inductor and a transistor.

15. The frequency multiplier of claim 14, wherein the inductor has a first end coupled to the current path and a second end coupled to a current terminal of the transistor.

16. The frequency multiplier of claim 14, wherein the transistor of the current helper section is biased to control a DC bias current in the mixer section to be greater than the DC bias current in the input section.

17. The frequency multiplier of claim 14, wherein the transistor of the current helper section is biased to control a DC bias current in the input section to be greater than the DC bias current in the mixer section.

18. The frequency multiplier of claim 14, wherein the inductor is configured to resonate out capacitance in the current path.

* * * * *